(12) United States Patent
Blatchford

(10) Patent No.: US 11,974,421 B2
(45) Date of Patent: Apr. 30, 2024

(54) SRAM LAYOUT FOR DOUBLE PATTERNING

(71) Applicant: Texas Instruments Incorporated, Dallas, TX (US)

(72) Inventor: James Walter Blatchford, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 128 days.

(21) Appl. No.: 17/071,724

(22) Filed: Oct. 15, 2020

(65) Prior Publication Data

US 2021/0028179 A1 Jan. 28, 2021

Related U.S. Application Data

(60) Continuation of application No. 16/211,753, filed on Dec. 6, 2018, now Pat. No. 10,840,250, which is a continuation of application No. 14/867,676, filed on Sep. 28, 2015, now Pat. No. 10,103,153, which is a division of application No. 13/622,971, filed on Sep. 19, 2012, now Pat. No. 10,181,474.

(60) Provisional application No. 61/536,346, filed on Sep. 19, 2011.

(51) Int. Cl.
| | |
|---|---|
| *H10B 10/00* | (2023.01) |
| *H01L 21/027* | (2006.01) |
| *H01L 21/311* | (2006.01) |
| *H01L 21/768* | (2006.01) |
| *H01L 27/02* | (2006.01) |

(52) U.S. Cl.
CPC ......... *H10B 10/12* (2023.02); *H01L 21/0274* (2013.01); *H01L 21/31144* (2013.01); *H01L 21/76802* (2013.01); *H01L 21/76877* (2013.01); *H01L 27/0207* (2013.01); *H10B 10/125* (2023.02)

(58) Field of Classification Search
CPC ... H10B 10/125; H10B 10/12; H01L 27/1104; H01L 27/0207; H01L 27/1108; H01L 27/76877; H01L 21/31144; H01L 21/76802; H01L 21/0274; H01L 21/76877
See application file for complete search history.

(56) References Cited

U.S. PATENT DOCUMENTS

| | | | |
|---|---|---|---|
| 6,303,422 B1 * | 10/2001 | Abe | ............... H10B 10/00 257/E23.153 |
| 7,786,017 B1 | 8/2010 | Morgenfeld et al. | |
| 2005/0191578 A1 | 9/2005 | Araki et al. | |
| 2006/0203530 A1 | 9/2006 | Venkatraman et al. | |
| 2009/0153826 A1 | 6/2009 | Sewell et al. | |
| 2009/0160064 A1 | 6/2009 | Jeong | |
| 2010/0283152 A1 | 11/2010 | Chen et al. | |
| 2011/0068400 A1 | 3/2011 | Wang et al. | |
| 2011/0183505 A1 | 7/2011 | Min et al. | |

(Continued)

*Primary Examiner* — Vongsavanh Sengdara
(74) *Attorney, Agent, or Firm* — Yudong Kim; Frank D. Cimino

(57) ABSTRACT

An integrated circuit with a SAR SRAM cell with power routed in metal-1. An integrated circuit with a SAR SRAM cell that has power routed in Metal-1 and has metal-1 and metal-2 integrated circuit and SAR SRAM cell patterns which are DPT compatible. A process of forming an integrated circuit with a SAR SRAM cell with DPT compatible integrated circuit and SAR SRAM cell metal-1 and metal-2 patterns.

18 Claims, 14 Drawing Sheets

(56) References Cited

U.S. PATENT DOCUMENTS

| | | | | |
|---|---|---|---|---|
| 2011/0317485 A1* | 12/2011 | Liaw | ................ | H01L 29/66795 |
| | | | | 365/182 |
| 2012/0049286 A1 | 3/2012 | Beyer et al. | | |
| 2012/0156881 A1 | 6/2012 | Haffner | | |
| 2012/0256235 A1 | 10/2012 | Pan et al. | | |
| 2012/0302059 A1* | 11/2012 | Aton | .................... | H01L 23/544 |
| | | | | 438/669 |
| 2013/0242645 A1* | 9/2013 | Calhoun | .......... | H01L 21/28097 |
| | | | | 438/587 |

\* cited by examiner

SRAM LAYOUT FOR DOUBLE PATTERNING

CROSS REFERENCE TO RELATED APPLICATIONS

This application is a continuation of U.S. Nonprovisional patent application Ser. No. 16/211,753 filed Dec. 6, 2018, which is a continuation of application Ser. No. 14/867,676 filed Sep. 28, 2015, now U.S. Pat. No. 10,103,153, which is a divisional of application Ser. No. 13/622,971, filed Sep. 19, 2012, now U.S. Pat. No. 10,181,474, which claims the benefit of U.S. Provisional Application Ser. No. 61/536,346, filed Sep. 19, 2011, the contents of each of which are herein incorporated by reference in its entirety.

This invention relates to the field of integrated circuit manufacturing. More particularly, this invention relates to double patterning photolithography for SAR SRAM cells.

BACKGROUND

The features in integrated circuit manufacture have continued to be reduced in size, while the wavelength of the light used to print these features has remained at about 193 nm. The resolution of these features in a photoresist pattern begins to blur at a pitch of about 100 nm. To enable manufacture of integrated circuits with smaller feature sizes, double patterning techniques (DPT) have been developed.

In double patterning technology one mask with a pitch (geometry width plus space between geometries) of about 50 nm may be decomposed into two masks, each with a pitch of about 100 nm. In a single patterning technology the space between two geometries is typically limited by photolithography. By decomposing the single pattern into two patterns, spaces approximately half the space of a single pattern technology may be formed using double patterning technology resulting in a significant reduction in chip area.

One DPT method is to pattern and etch a given layer using a first mask and then to pattern and etch the same layer using a second mask. Another DPT method is to first expose the first mask in a photoresist layer and then expose the second mask in the same photoresist layer prior to etching.

DPT technology becomes especially challenging for SRAM cells where geometries are often pushed significantly below the minimum allowed design rules for random logic. Techniques used to ensure a given mask level is DPT compatible are generally inadequate for SRAM cells.

A circuit diagram of a typical 6 transistor (6-T) SRAM cell is shown in FIG. 1. The 6-T SRAM cell consists of two inverters with cross coupled gates. A first inverter is composed of pullup PMOS transistor 28 and pulldown NMOS transistor 22. A second inverter is composed of pullup PMOS transistor 34 and pulldown NMOS transistor 38. Both inverters are connected between power (Vdd) 30 and ground (Vss) 20. The gate of the first inverter 42 is connected to the storage node (SN2) of the second inverter and the gate of the second inverter 40 is connected to the storage node (SN1) of the first inverter. Pass transistor 24 connects the storage node (SN1) of the first inverter to the first bitline 26 and pass transistor 38 connects the storage node (SN2) of the second inverter to the second bitline 36. The gates of the pass transistors, 24 and 38 are connected to wordline 32.

When the voltage on SN2 is low, because SN2 is coupled to the gate 42 of the first inverter, the voltage on the gate is also low so the NMOS transistor 22 of the first inverter is off and the PMOS transistor 28 of the first inverter is on. Since the PMOS transistor 28 is connected to Vdd 30 and is turned on, the storage node of the first inverter (SN1) is charged to approximately at Vdd. SN1 is coupled to the gate 40 of the second inverter so the NMOS transistor 38 of the second inverter is on and the PMOS transistor 34 of the second inverter is off. The storage node of the second inverter (SN2) is discharged through NMOS transistor 38 to approximately ground 20.

A top-down view of the active, gate, contact, and metal1 patterns of a typical small aspect ratio (SAR) SRAM cell are shown in FIG. 2. Top-down views of the active (FIG. 3A), gate (FIG. 3B), contact (FIG. 3C), metal1 (FIG. 3D), via-1 (FIG. 3E), and metal-2 (FIG. 3F) patterns are shown in FIGS. 3A through 3F. While it may be possible to decompose the active (3A), gate (3B), contact (3C), and via-1 (3E) patterns into two patterns compatible with double patterning technology (DPT), the wiring levels metal-1 (3D) and metal-2 (3F) are not DPT compatible. It is impossible to decompose the metal-1 pattern (3D) into a two color pattern with no design rule conflicts. Likewise it is impossible to decompose the metal-2 pattern (3F) into a two color pattern with no design rule conflicts. The size of the SAR SRAM cell is therefore limited by the metal-1 and metal-2 patterns. For a 20 nm technology node the area of SAR SRAM cell is limited to about 0.08 um$^2$ or greater.

SUMMARY

An integrated circuit with a SAR SRAM cell with power routed in metal-1. An integrated circuit with a SAR SRAM cell that has power routed in Metal-1 and has metal-1 and metal-2 integrated circuit and SAR SRAM cell patterns which are DPT compatible. A process of forming an integrated circuit with a SAR SRAM cell with DPT compatible integrated circuit and SAR SRAM cell metal-1 and metal-2 patterns.

DETAILED DESCRIPTION OF EXAMPLE EMBODIMENTS

Figure 4:
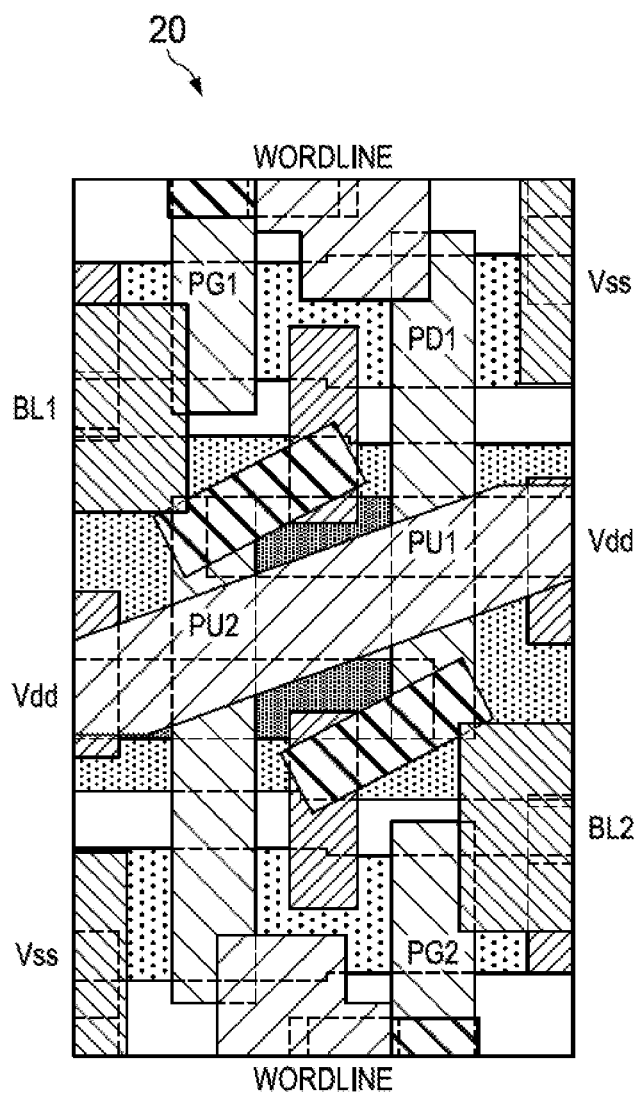
FIG. 4 is a top down view of the active, gate, contact, and metal-1 patterns of an embodiment 6 transistor SAR SRAM cell formed according to principles of the invention.

A top down view of the critical patterns through metal1 (active, poly, contact, metal1) of an embodiment small aspect ratio (SAR) SRAM cell that has been redesigned so that the critical patterns through metal-2 (active, gate, contact, metal-1, via-1, and metal-2) are double patterning technology (DPT) compatible is shown in FIG. 4.

Figure 1:
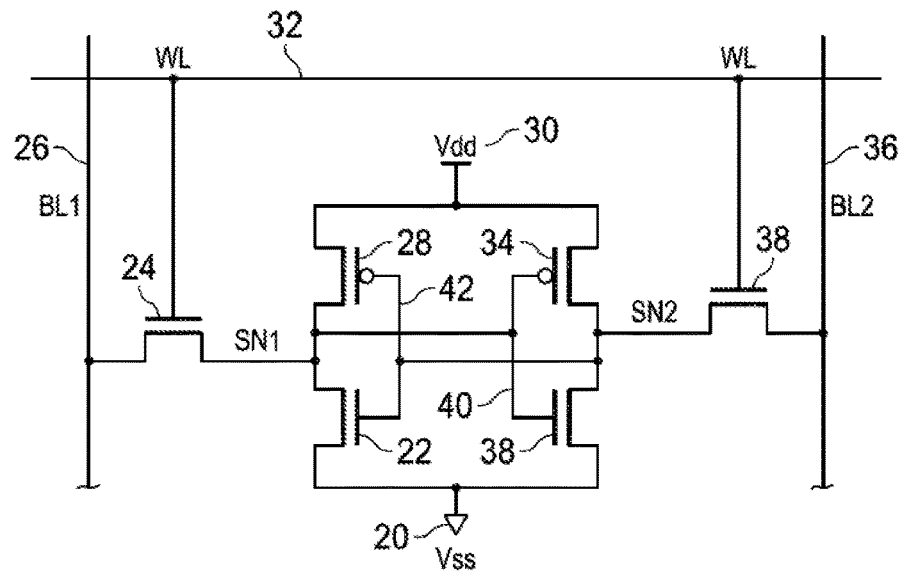
FIG. 1 (Prior art) is a circuit diagram of a 6 transistor SRAM cell.
Figure 2:
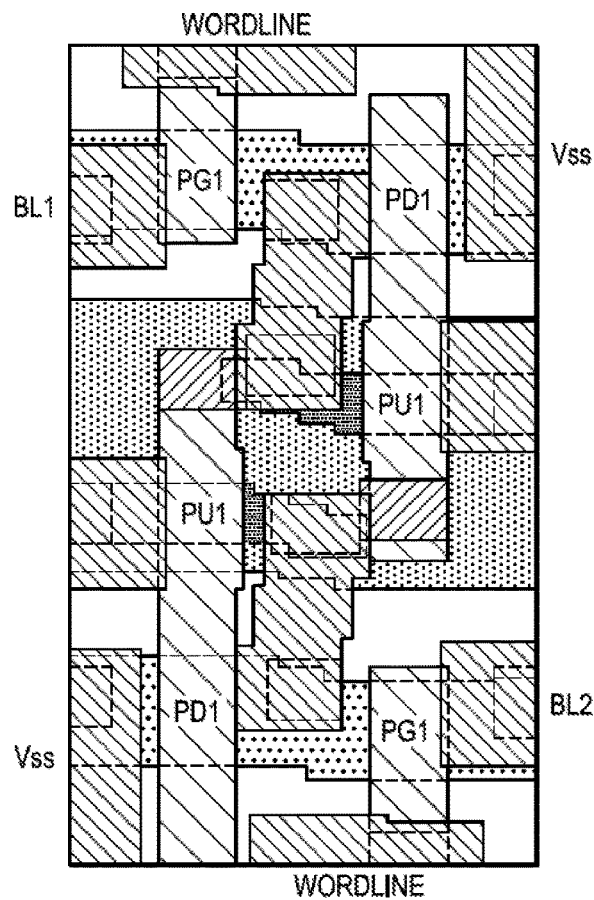
FIG. 2 (Prior art) is a top down view of the active, gate, contact, and metal-1 patterns of a conventional 6 transistor SAR SRAM cell.

A key feature of the embodiment SAR SRAM design in FIG. 4 is that unlike the conventional SAR SRAM cell shown in FIG. 2, where power (Vdd) is routed in metal-2, power in the embodiment SAR SRAM cell is routed in metal-1. Redesigning the embodiment SAR SRAM cell to move power routing to metal-1 enables the metal-1 pattern (5D) and metal-2 (5F) pattern to be laid out with DPT compatibility.

Figure 3A:
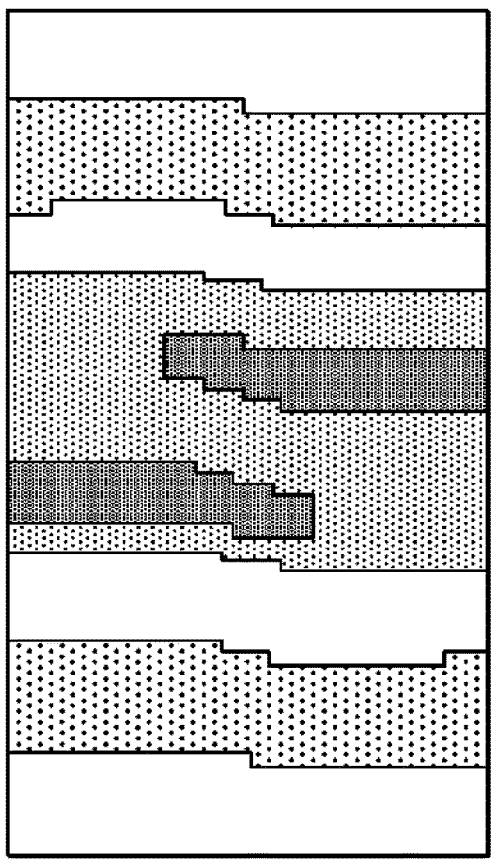
FIGS. 3A-3F (Prior art) are the active, gate, contact, metal-1, via-1, and metal-2 patterns of the 6 transistor SAR SRAM cell of FIG. 2.
Figure 3B:
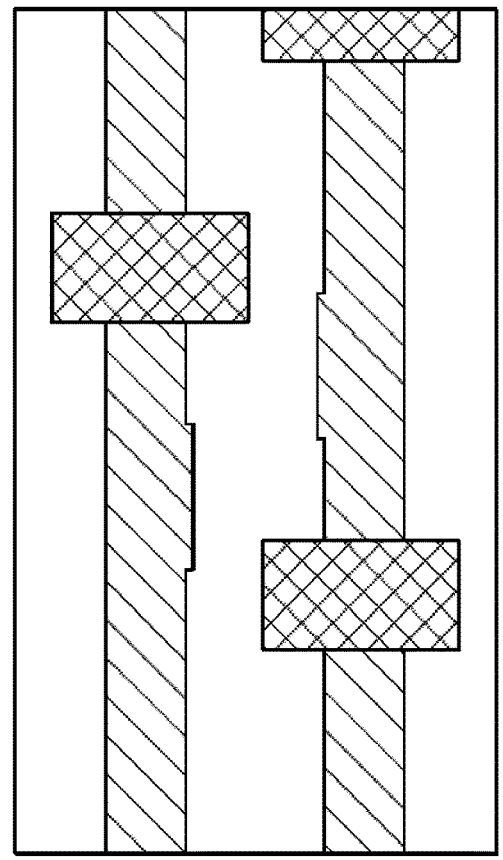
Figure 3C:
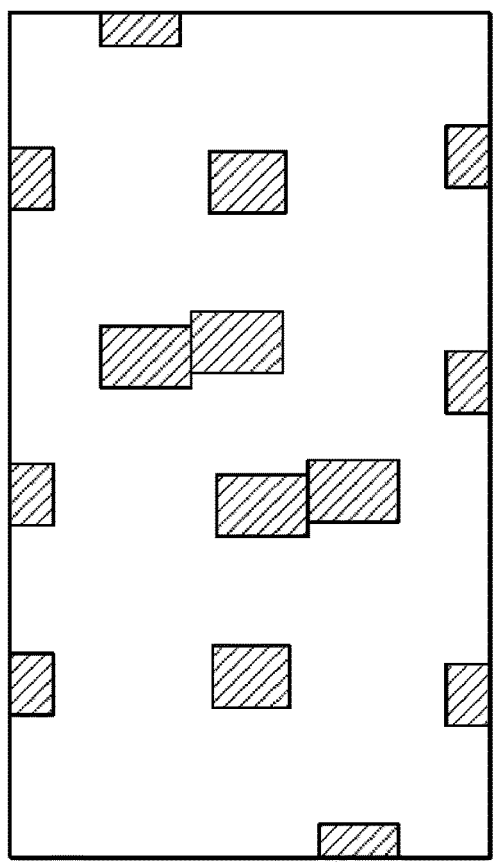
Figure 3D:
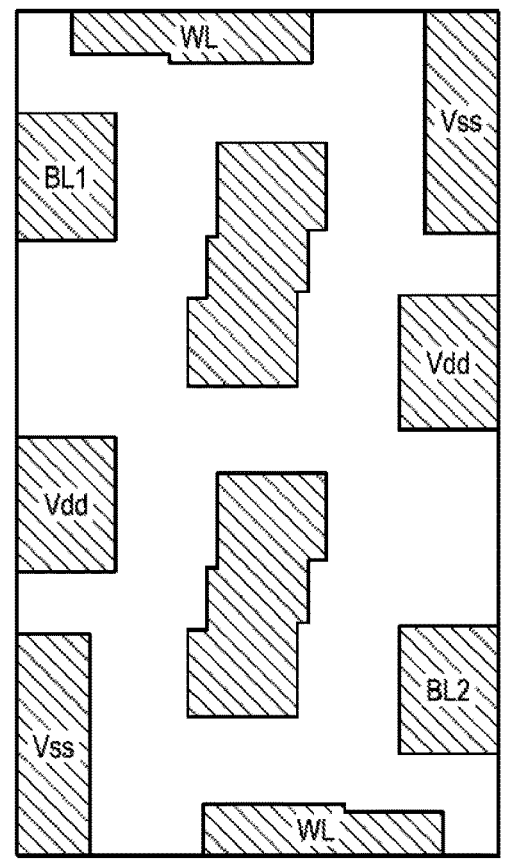
Figure 3E:
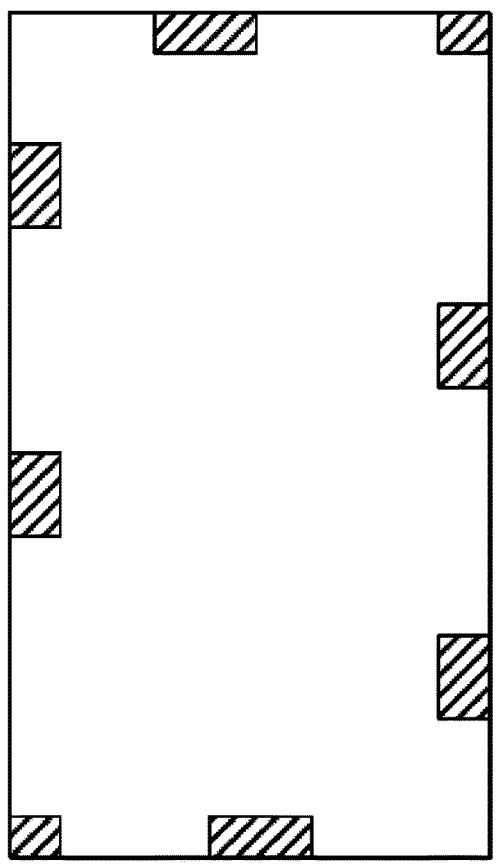
Figure 3F:
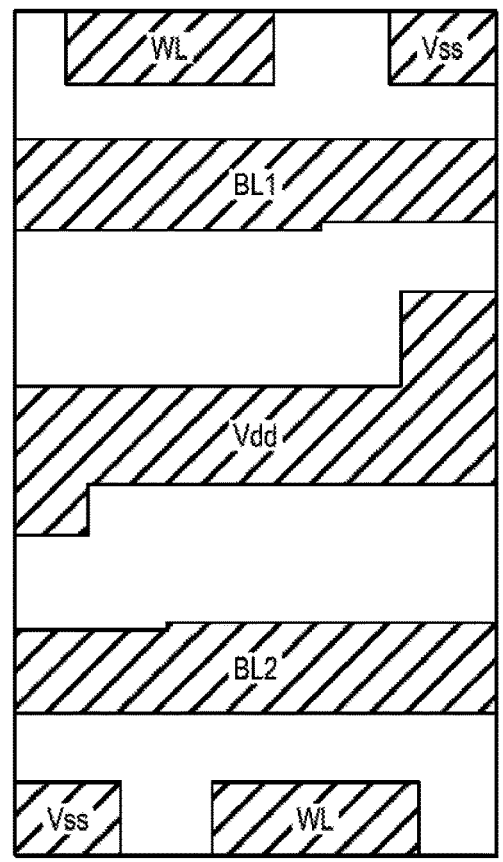

In the conventional SAR SRAM cell both the bitlines and power (Vdd) are routed in metal-2 as shown in FIG. 3F. Neither metal-1 pattern shown in FIG. 3D nor metal-2 pattern shown in FIG. 3F in the conventional SAR SRAM cell are DPT compatible.

Figure 5A:
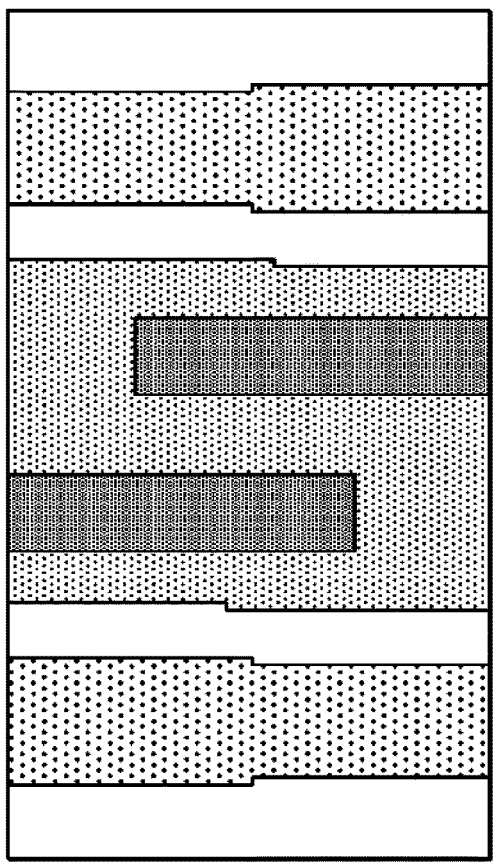
FIGS. 5A-5F are the active, gate, contact, metal-1, via-1, and metal-2 patterns of the embodiment 6 transistor SAR SRAM cell of FIG. 4 formed according to principles of the invention.
Figure 5B:
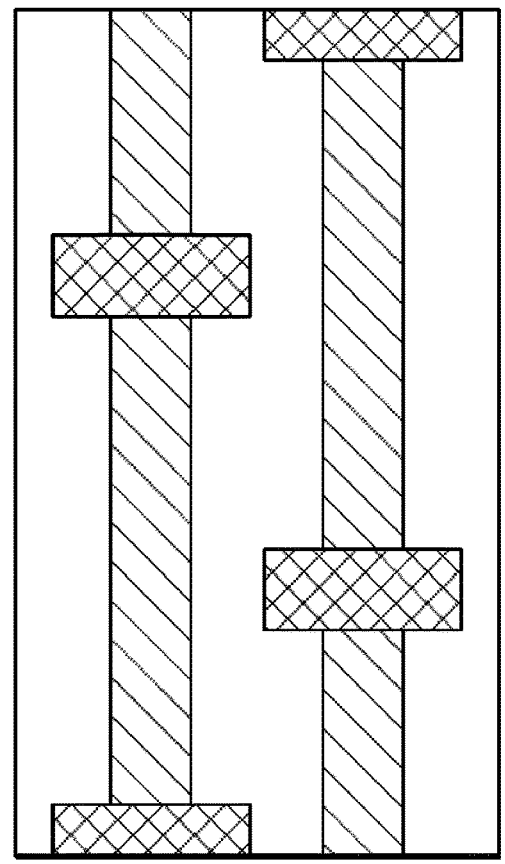
Figure 5C:
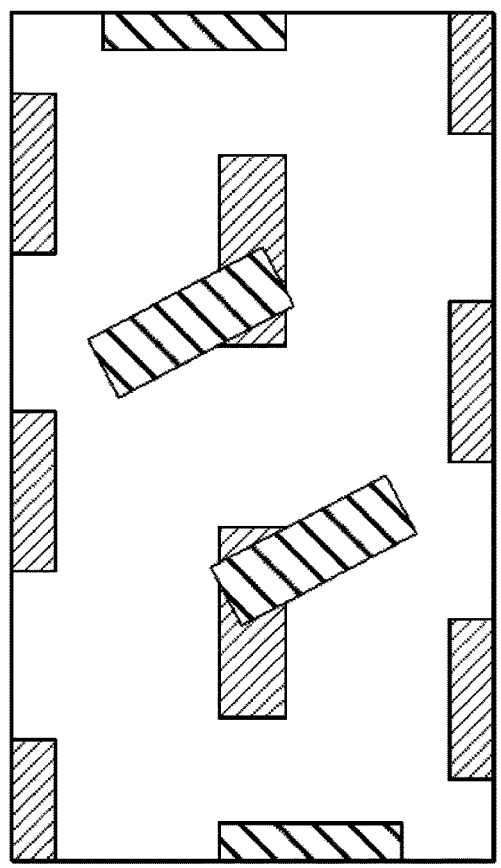
Figure 5D:
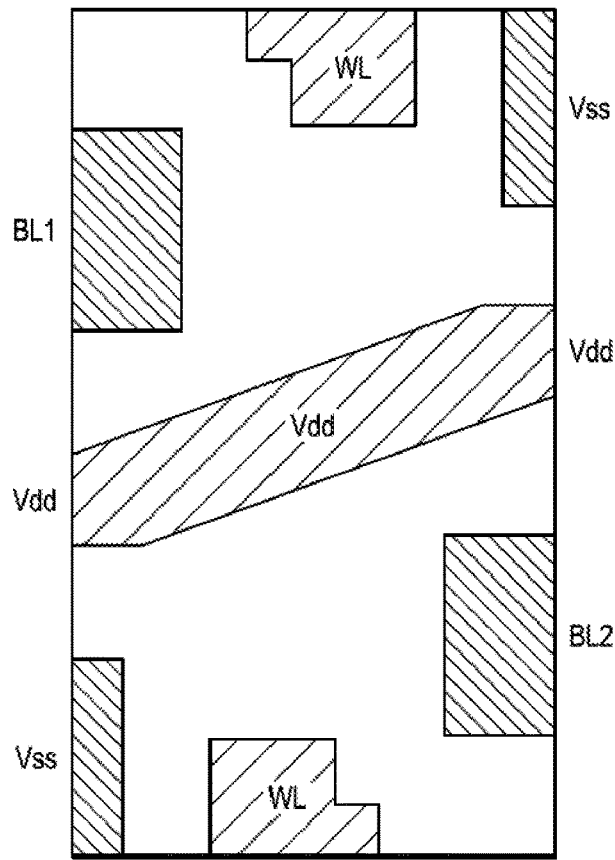
Figure 5E:
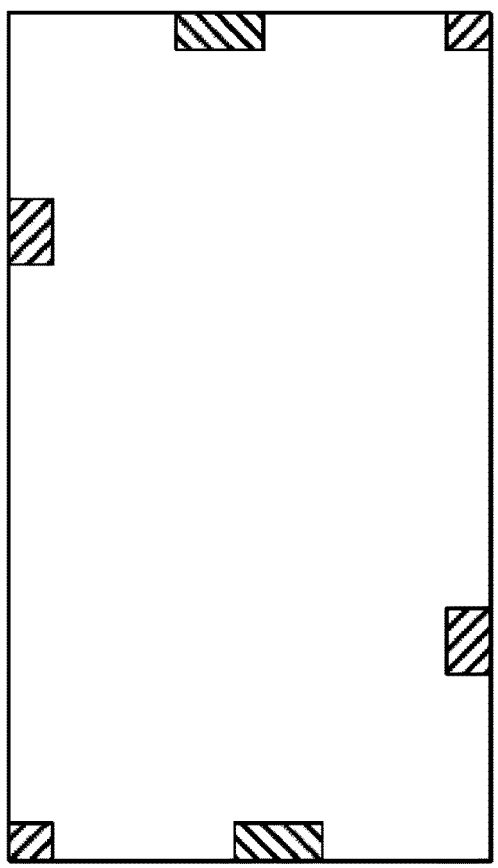
Figure 5F:
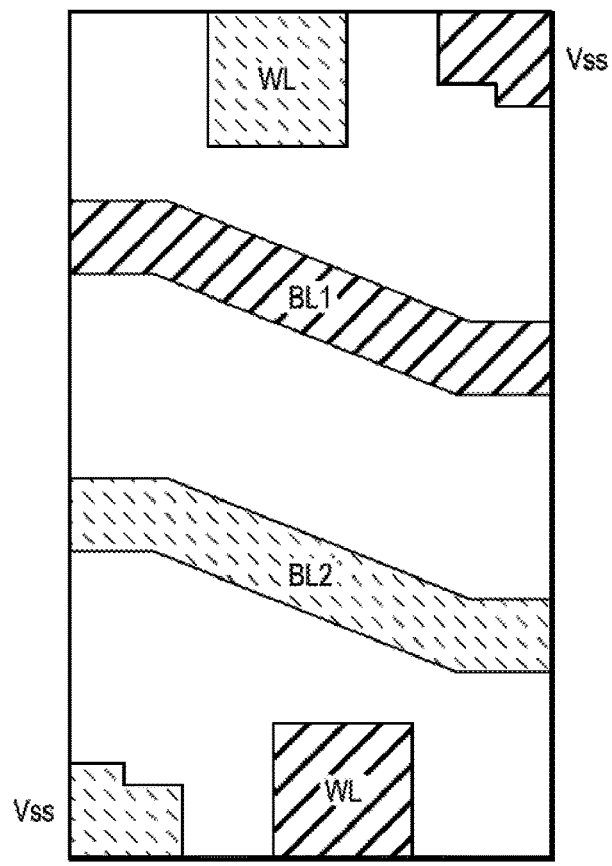

In the embodiment SAR SRAM cell the bitlines are routed in metal-2 as shown in FIG. 5F and power (Vdd) is routed in metal-1 as shown in FIG. 5D. Since these patterns are now DPT compatible, the smaller first DPT geometry to second DPT geometry space design rule may be used to reduce the size of the SRAM cell.

As shown in FIGS. 6 through 10 each of the critical patterns from gate through metal-2 of the embodiment SAR SRAM cell are DPT compatible enabling a smaller SAR SRAM cell.

Figure 6:
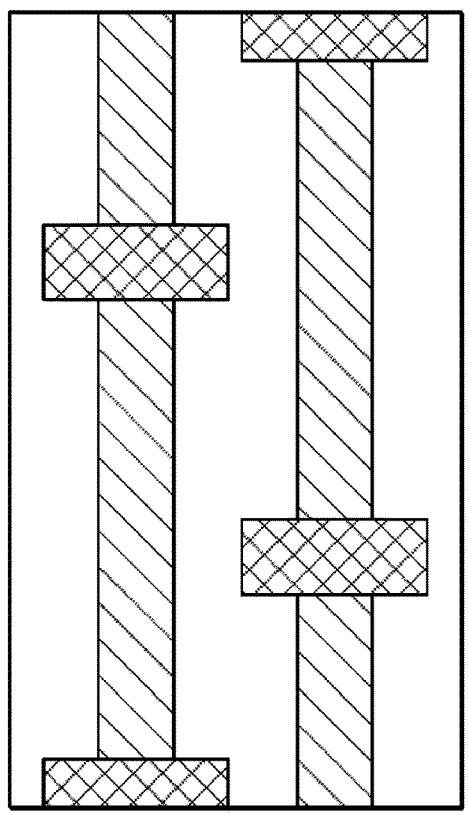
FIGS. 6, 6A, and 6B are plan views of the DPT compatible poly patterns of the embodiment SAR SRAM cell of FIG. 4.
Figure 6A:
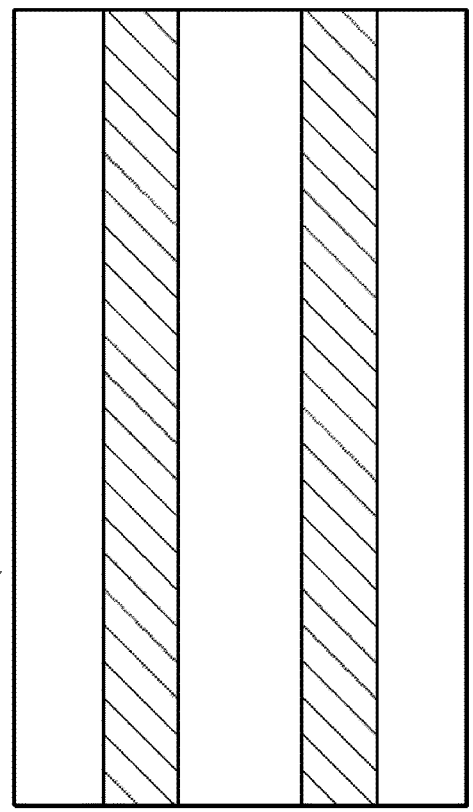
Figure 6B:
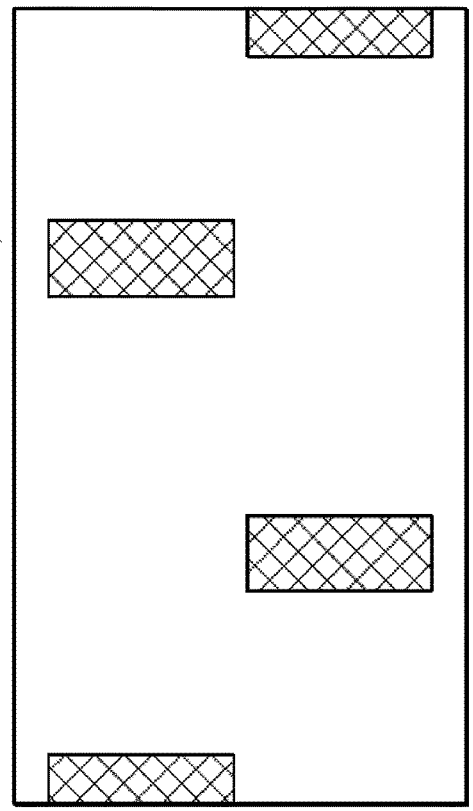

The gate level pattern in FIG. 6 may be decomposed into a first DPT gate pattern in FIG. 6A and a second DPT gate pattern in FIG. 6B.

Figure 7:
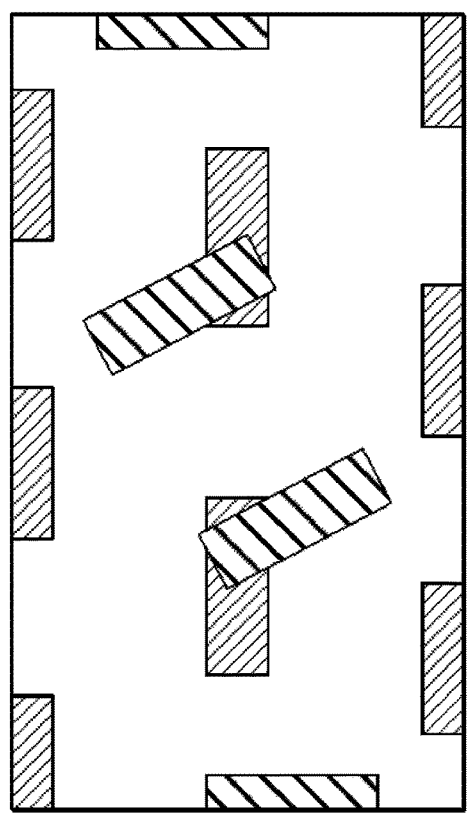
FIGS. 7, 7A, and 7B are plan views of the DPT compatible contact patterns of the embodiment SAR SRAM cell of FIG. 4 formed according to principles of the invention.
Figure 7A:
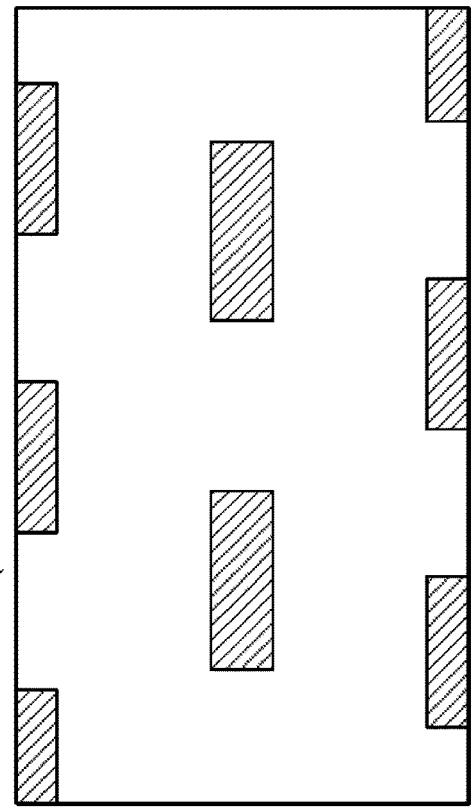
Figure 7B:
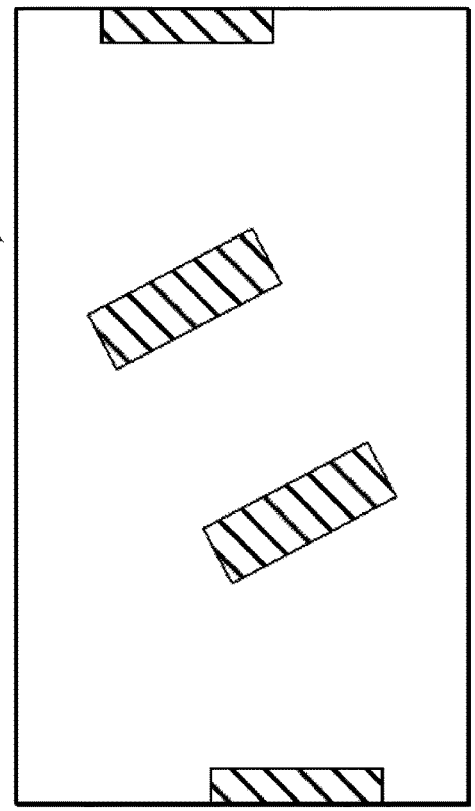

The contact level pattern in FIG. 7 may be decomposed into a first DPT contact pattern in FIG. 7A and a second DPT contact pattern in FIG. 7B.

Figure 8:
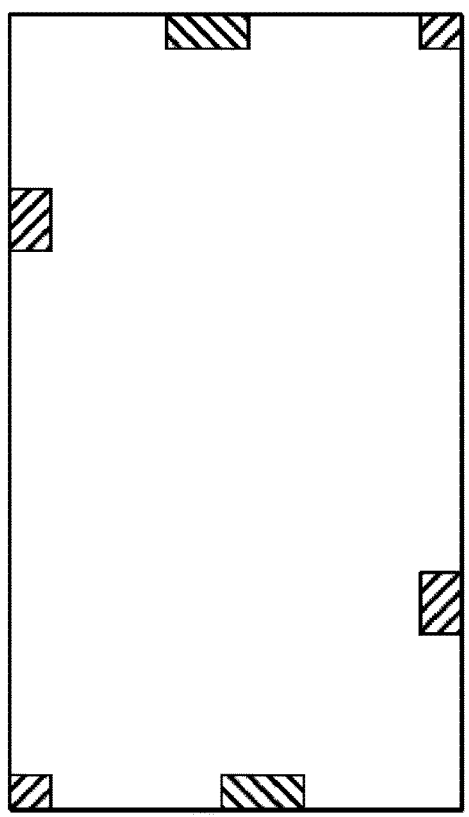
FIGS. 8, 8A, and 8B are plan views of the DPT compatible metal-1 patterns of the embodiment SAR SRAM cell of FIG. 4 formed according to principles of the invention with power routed on metal-1.
Figure 8A:
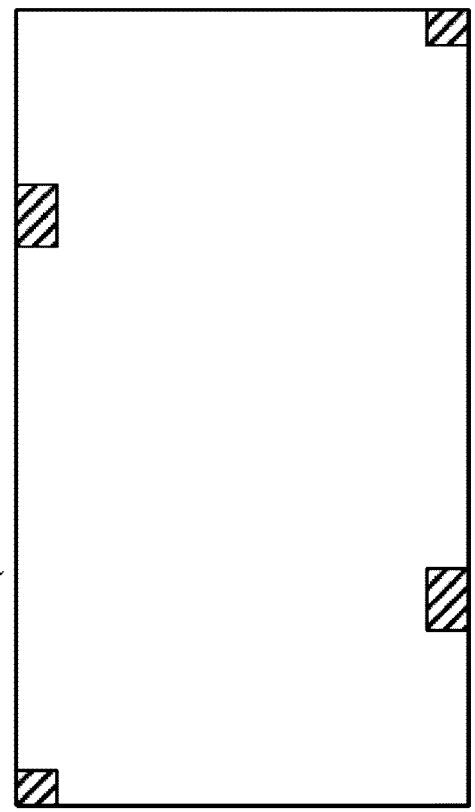
Figure 8B:
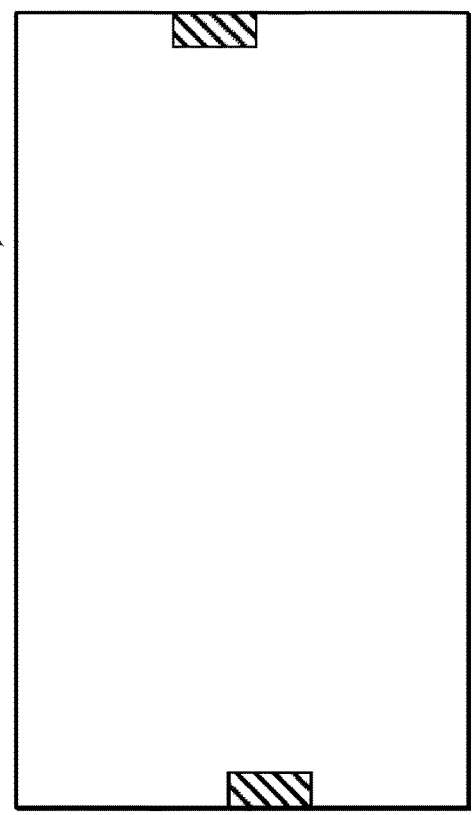

The metal-1 level pattern in FIG. 8 may be decomposed into a first DPT metal-1 pattern in FIG. 8A and a second DPT metal-1 pattern in FIG. 8B.

Figure 9:
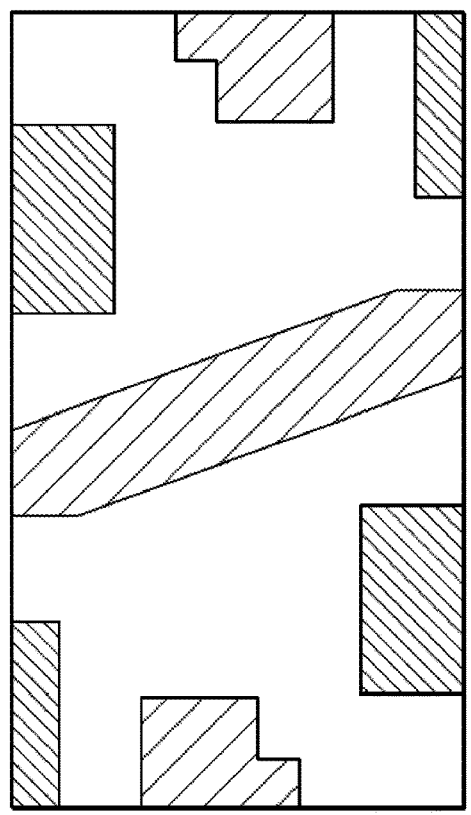
FIGS. 9, 9A, and 9B are plan views of the DPT compatible via-1 patterns of the embodiment SAR SRAM cell of FIG. 4 formed according to principles of the invention.
Figure 9A:
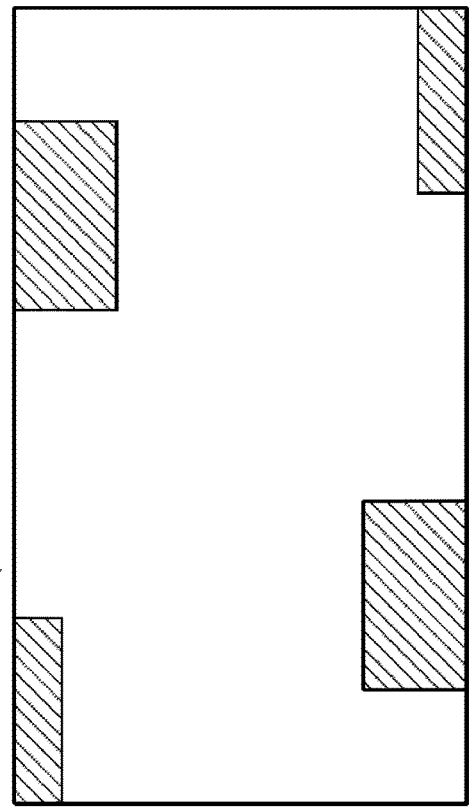
Figure 9B:
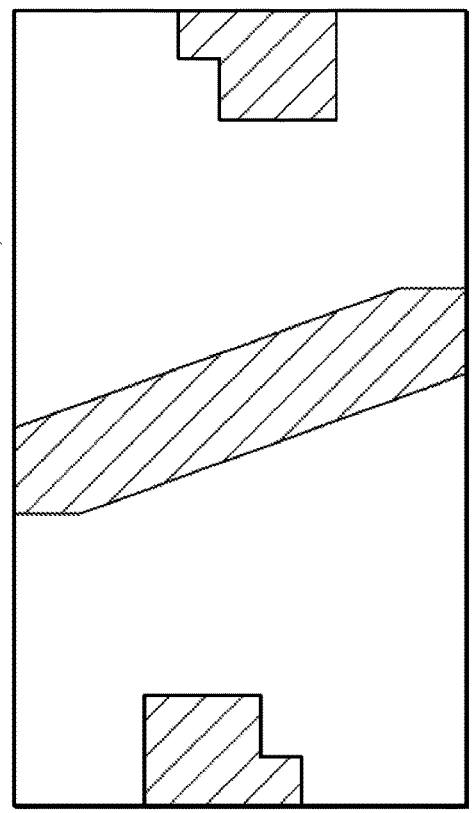

The via-1 level pattern in FIG. 9 may be decomposed into a first DPT via-1 pattern in FIG. 9A and a second DPT via-1 pattern in FIG. 9B.

Figure 10:
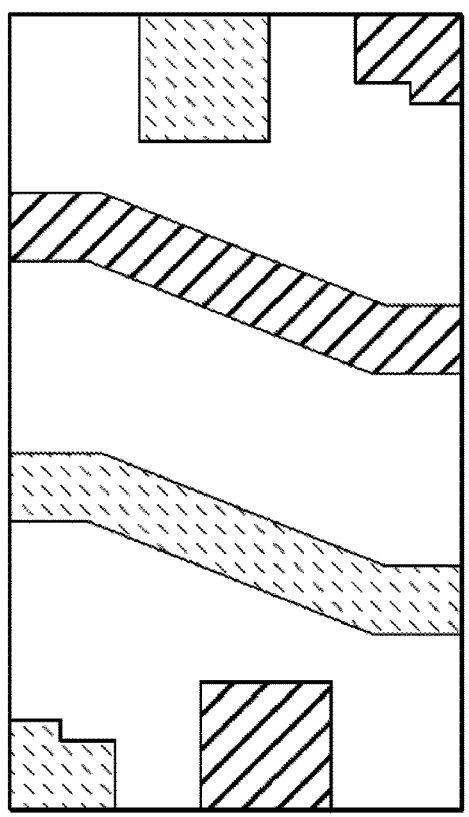
FIGS. 10, 10A, and 10B are plan views of the DPT compatible metal-2 patterns of the embodiment SAR SRAM cell of FIG. 4 formed according to principles of the invention.
Figure 10A:
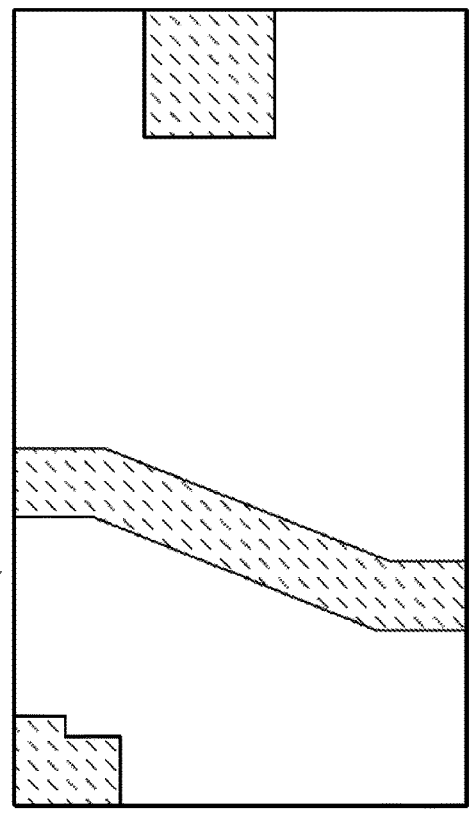
Figure 10B:
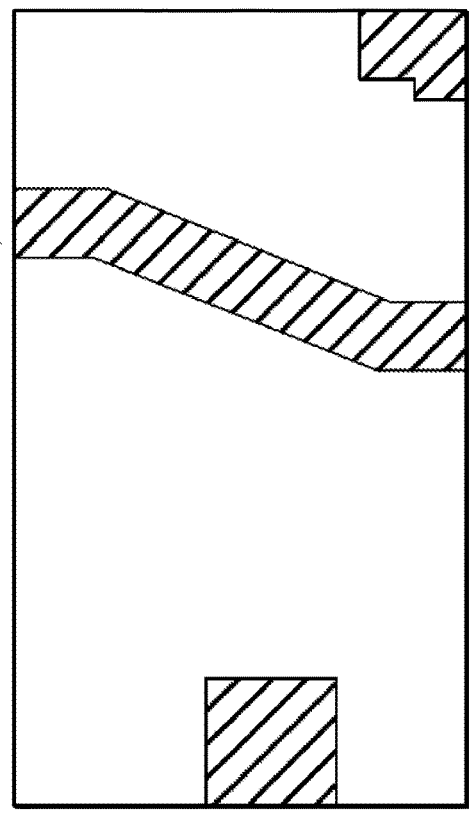

The metal-2 level pattern in FIG. 10 may be decomposed into a first DPT metal-2 pattern in FIG. 10A and a second DPT metal-2 pattern in FIG. 10B.

Redesigning the embodiment SAR SRAM cell to enable critical levels to be DPT compatible allows a smaller SAR SRAM cell size. For example, at the 20 nm technology node the conventional SAR SRAM cell in FIG. 2 whose size is limited by single pattern technology metal-1 and metal-2 patterns has a size of about 0.08 um$^2$ or larger. The size of the embodiment SAR SRAM cell in FIG. 4 may be reduced to about 0.06 um$^2$ by redesigning the SAR SRAM cell with DPT compatible critical patterns. The about 25% reduction in SAR SRAM cell size becomes a very significant area savings for integrated circuits with large SRAM memory arrays.

Figure 11:
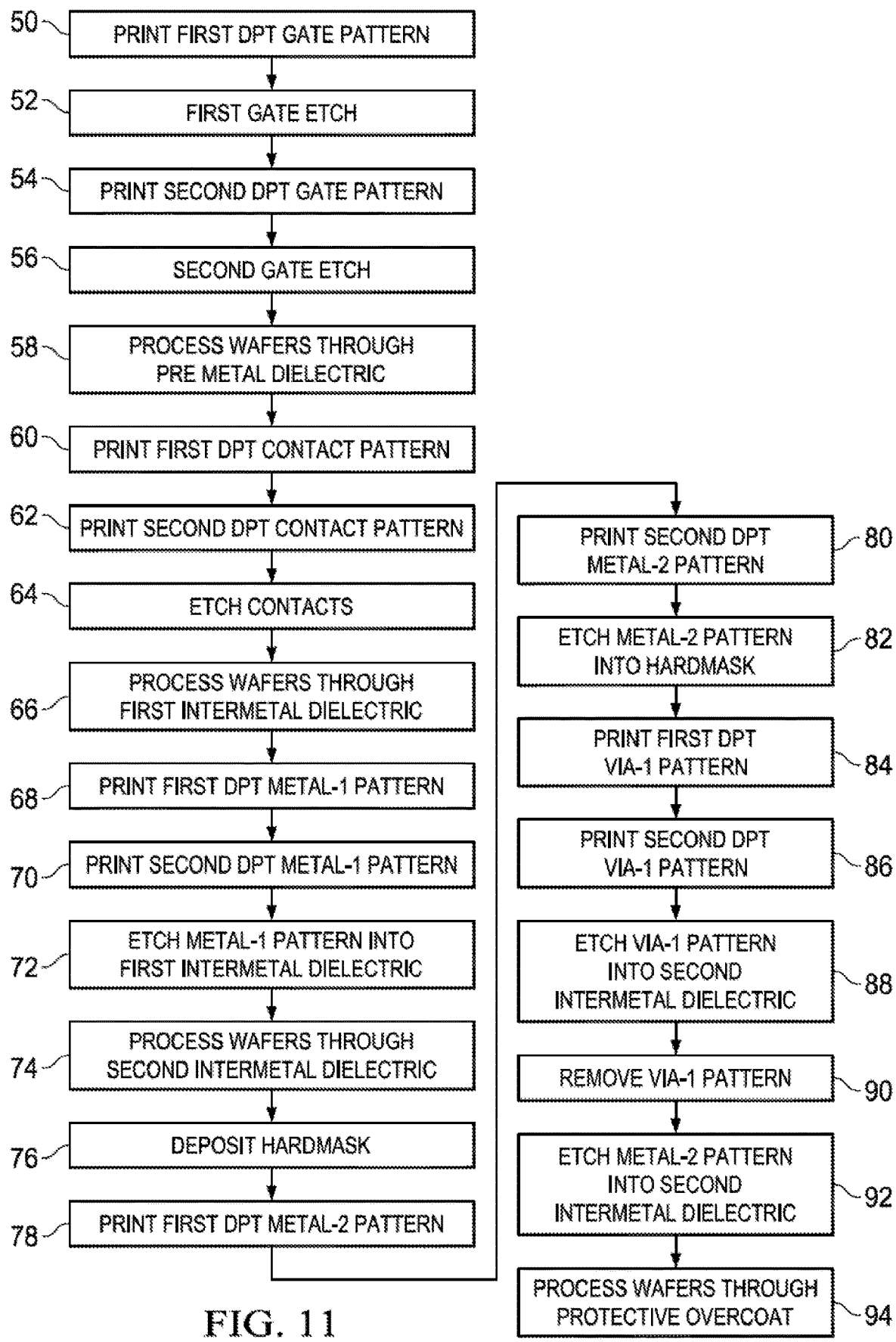
FIG. 11 is a process flow diagram which describes an embodiment process flow for forming and integrated circuit with a SAR SRAM cell according to principles of the invention.

A process flow for producing the embodiment SAR SRAM cell is shown in FIG. 11.

After an integrated circuit wafer is processed through gate poly deposition, the wafer is patterned with a first DPT poly pattern (FIG. 6A) in step 50 and the poly is etched to form gate geometries.

In step 54 a second DPT poly pattern (FIG. 6B) is applied and the poly is again etched in step 56 to cut the gate geometries separate transistor gates.

In step 58 the wafer is processed through the integrated circuit process steps between gate etch and contact pattern. These steps may include extension (LDD) pattern and implant for NMOS and PMOS transistors, sidewall dielectric deposition and etch, source and drain pattern and implant for NMOS and PMOS, silicide formation, contact etch stop deposition and premetal dielectric deposition and planarization. Other process steps such as stress memorization, dual stress liner formation may also be included.

In step 60 the wafer may be coated with resist and a first DPT contact pattern printed in the resist. Next in step 62 a second DPT contact pattern may be printed in the same resist. By printing the contact level using two DPT contact masks, tighter first DPT contact to second DPT contact space design rule may be used to reduce the size of the embodiment SAR SRAM cell. (Contact-to-contact space design rule on the same contact mask is larger than the contact-to-contact space design rule between contacts on different DPT contact masks.)

In step 64 the contacts are etched through the PMD and contact etch stop layers to form contacts to the gates and source and drain diffusion areas.

In step 66 the wafer is processed through the integrated circuit process steps between contact etch and metal-1 pattern. These steps may include contact liner deposition, contact plug deposition and planarization, and first intermetal dielectric deposition (IMD-1).

In step 68 photoresist is coated on the first intermetal dielectric and a first DPT metal-1 pattern is printed. In step 70 a second DPT metal-1 pattern is printed in the same resist. By printing the metal-1 interconnect level using a first DPT metal-1 mask and a second DPT metal-1 mask, tighter first DPT metal-1 geometry to second DPT metal-1 geometry space design rule may be used to reduce the size of the embodiment SAR SRAM cell. (Metal-1 geometry to metal-1 geometry space design rule for metal-1 geometries on the same contact mask is larger than the metal-1 geometry to metal-1 geometry space design rule between metal-1 geometries on different DPT metal-1 masks.)

In step 72 metal-1 trenches are etched into IMD-1 to form contact to the underlying contact plugs.

In step 74 the wafer is processed through the integrated circuit process steps between metal-1 etch and metal-2 pattern. These steps may include metal-1 liner deposition, metal-1 deposition and planarization, and second intermetal dielectric deposition (IMD-2).

In step 76 a hardmask which may be a dielectric such as SiN or silicon carbide may be deposited.

In step 78 photoresist is coated on the wafer and a first DPT metal-2 pattern is printed. In step 80 a second DPT metal-2 pattern is printed in the same resist. By printing the metal-2 interconnect level using a first DPT metal-2 mask and a second DPT metal-2 mask, tighter first DPT metal-2 geometry to second DPT metal-2 geometry space design rule may be used to reduce the size of the embodiment SAR SRAM cell. (Metal-2 geometry to metal-2 geometry space design rule for metal-2 geometries on the same contact mask is larger than the metal-2 geometry to metal-2 geometry space design rule between metal-2 geometries on different DPT metal-2 masks.)

In step 82 metal-2 pattern is etched into the hardmask.

In step 84 resist is coated on the hardmask containing the embodiment metal-2 pattern. A first DPT via-1 pattern is then printed in the resist. In step 86 a second DPT via-2 pattern is also printed in the same resist. By printing the vi-1 level using two DPT via-1 masks, tighter first DPT via-1 to second DPT via-1 space design rule may be used to reduce the size of the embodiment SAR SRAM cell. (Via-1-to-via-1 space design rule on the same via-1 mask is larger than the via-1-to-via-1 space design rule between via-1 geometries on different DPT via-1 masks.)

In step 88 the via-1s are etched into the IMD-2 layer. They may be partially etched through the IMD-2 layer or they may be etched completely through the IMD-2 layer.

In step 90 the via-1 pattern is removed from the integrated circuit wafer.

In step 92 using the hardmask metal-2 pattern, metal-2 trenches are etched into the IMD-2 layer. At the same time, the via-1s are etched completely through the IMD-2 layer to contact the metal-1 if they were not previously etched through.

In step 94 the integrated circuit is processed through metal-2 deposition and planarization and through additional levels of interconnect if needed followed by protective overcoat and bondpad formation.

The embodiment process flow describes formation of an integrated circuit with an embodiment SAR SRAM cell formed according to principles of the invention. Critical patterns including metal-1, metal-2, contact, and via-1 are DPT compatible in the integrated circuit and also DPT compatible within the SAR SRAM cell. The DPT compatibility within the embodiment SAR SRAM cell is made possible by routing power (Vdd) in the metal-1 level. Those skilled in the art may generate an alternative process flow using DPT compatible contact, metal-1, via-1, and metal-2 patterns within a SAR SRAM cell that are also within the scope of this invention.

Those skilled in the art to which this invention relates will appreciate that many other embodiments and variations are possible within the scope of the claimed invention.

What is claimed is:

1. A method of fabricating an integrated circuit having an SRAM, comprising:
    forming a gate layer having a first gate structure with a long dimension extending in a first direction, the long dimension being a width or a length from a top down view of the SRAM;
    forming a contact layer having a first contact with a first portion with a long dimension extending in the first direction, the long dimension being a width or a length from the top down view and a second portion with a long dimension extending in a second direction at a diagonal from the first direction, the long dimension being a width or a length from the top down view;
    forming a power (Vdd) routing in a metal-1 layer, a portion of the power routing extending over the first gate structure and having a long dimension that extends in a third direction at a diagonal from the first direction, the long dimension being a width or a length from the top down view, wherein the portion of the power routing is defined with a first metal-1 mask and the metal-1 layer includes one or more portions defined with a second metal-1 mask different than the first metal-1 mask; and
    a first bit line routing and a second bit line routing in a metal-2 layer.

2. The method of claim 1, wherein the first contact extends from a first location overlapping the first gate structure to a second location overlapping a shared active region of a first pass gate transistor and a first pull down transistor.

3. The method of claim 1, wherein the contact layer includes a second contact with a first portion with a long dimension extending in the first direction, the long dimension being a width or a length from the top down view and a second portion with a long dimension extending in a fourth direction at a diagonal from the first direction, the long dimension being a width or a length from the top down view.

4. The method of claim 1, wherein a portion of the first bit line routing has a long dimension that extends in a fifth direction at a diagonal to the first direction, the long dimension being a width or a length from the top down view and a portion of the second bit line routing has a long dimension that extends in the fifth direction, the long dimension being a width or a length from the top down view.

5. A method of fabricating an integrated circuit having an SRAM, comprising: forming a gate layer having a first gate structure with a long dimension extending in a first direction; forming a contact layer having a first contact with a first portion with a long dimension extending in the first direction and a second portion with a long dimension extending in a second direction at a diagonal from the first direction; forming a power (Vdd) routing in a metal-1 layer, a portion of the power routing extending over the first gate structure and having a long dimension that extends in a third direction at a diagonal from the first direction, wherein the contact layer extends between the gate layer and the metal-1 layer; and a first bit line routing and a second bit line routing in a metal-2 layer, wherein the first contact extends from a first location overlapping the first gate structure to a second location overlapping a shared active region of a first pass gate transistor and a first pull down transistor; and the first gate structure forms a gate of a second pull up transistor and a second pull down transistor.

6. A method of forming an integrated circuit having an SRAM, comprising:
    forming a gate layer using a first double patterning process, the gate layer having a first gate structure with a length dimension from a top down view of the SRAM extending in a first direction;
    forming a contact layer using a second double patterning process, the contact layer having a first contact with a first portion with a length dimension from the top down view extending in the first direction and a second portion with a length dimension from the top down view extending in a second direction at a diagonal from the first direction;
    forming a metal-1 layer over the contact layer using a third double patterning process, the metal-1 layer containing a power (Vdd) routing, a portion of the power routing extending over the first gate structure and having a length dimension from the top down view that extends in a third direction at a diagonal from the first direction, wherein the portion of the power routing is defined with a first metal-1 mask and the metal-1 layer includes one or more portions defined with a second metal-1 mask different than the first metal-1 mask; and forming a metal-2 layer over the metal-1 layer using a fourth double patterning process, the metal-2 layer including a first bit line routing and a second bit line routing.

7. The method of claim 6, wherein the contact layer includes a contact plug.

8. The method of claim 6, wherein the contact layer includes a contact liner and a contact plug.

9. The method of claim 6, wherein the gate layer comprises polysilicon.

10. The method of claim 6, wherein the contact layer further includes a second contact with a first portion with a length dimension from the top down view extending in the first direction and a second portion with a length dimension from the top down view extending in a fourth direction at a diagonal from the first direction.

11. The method of claim 10, wherein the first portion of the second contact corresponds to a pattern from a first patterning process of the second double patterning process and the second portion of the second contact corresponds to a pattern from a second patterning process of the second double patterning process.

12. The method of claim 11, wherein the first portion of the first contact corresponds to another pattern from the first patterning process of the second double patterning process and the second portion of the first contact corresponds to another pattern from the second patterning process of the second double patterning process.

13. The method of claim 6, wherein the first portion of the first contact corresponds to a pattern from a first patterning process of the second double patterning process and the second portion of the first contact corresponds to a pattern from a second patterning process of the second double patterning process.

14. The method of claim 6, wherein the first bit line routing corresponds to a pattern from a first patterning process of the fourth double patterning process and the second bit line routing corresponds to a pattern from a second patterning process of the fourth double patterning process.

15. A method of forming an integrated circuit having an SRAM, comprising:
depositing a polysilicon layer;
patterning the polysilicon layer using a first double patterning technology (DPT) process including:
applying a first DPT polysilicon pattern and etching the polysilicon layer with the first DPT polysilicon pattern to form gate line geometries; and
applying a second DPT polysilicon pattern and etching the gate line geometries to form transistor gates;
depositing a pre-metal dielectric layer;
patterning the pre-metal dielectric layer using a second DPT process including:
forming a first resist layer;
applying a first DPT contact pattern to the first resist layer;
after applying the first DPT contact pattern, applying a second DPT contact pattern to the first resist layer; and
etching contacts through the pre-metal dielectric layer using the first and second DPT contact patterns, the contacts including a first contact with a first portion with a long dimension extending in a first direction according to the first DPT contact pattern and a second portion with a long dimension extending in a second direction at a diagonal from the first direction according to the second DPT contact pattern;
forming metal-1 geometries using a third DPT process, the metal-1 geometries including a power routing, a portion of the power routing extending over several of the transistor gates and having a long dimension that extends in a third direction at a diagonal from the first direction; and
forming metal-2 geometries using a fourth DPT process, the metal-2 geometries including a first bit line routing and a second bit line routing.

16. The method of claim 15, wherein the step of forming metal-1 geometries comprises:
forming a first intermetal dielectric;
forming a second resist layer over the first intermetal dielectric;
applying a first DPT metal-1 pattern to the second resist layer;
applying a second DPT metal-1 pattern to the second resist layer;
etching the first intermetal dielectric using the first and second DPT metal-1 patterns to form metal-1 trenches;
depositing a metal-1 liner in the metal-1 trenches;
depositing metal-1 in the metal-1 trenches; and
planarizing the metal-1 liner and metal-1.

17. The method of claim 15, wherein the step of forming metal-2 geometries comprises:
forming a second intermetal dielectric;
forming a hard mask on the second intermetal dielectric;
forming a third resist layer over the hard mask;
applying a first DPT metal-2 pattern to the third resist layer;
applying a second DPT metal-2 pattern to the third resist layer;
etching the hard mask using the first and second DPT metal-2 pattern;
etching the second intermetal dielectric using the etched hard mask to form metal-2 trenches;
depositing a metal-2 liner in the metal-2 trenches;
depositing metal-2 in the metal-2 trenches; and
planarizing the metal-2 liner and metal-2.

18. The method of claim 15, wherein the contacts further include a second contact with a first portion with a long dimension extending in the first direction according to the first DPT contact pattern and a second portion with a long dimension extending in a fourth direction at a diagonal from the first direction according to the second DPT contact pattern.

* * * * *